(12) United States Patent
Joo et al.

(10) Patent No.: US 11,615,898 B2
(45) Date of Patent: Mar. 28, 2023

(54) METHOD AND APPARATUS FOR WRAPPING FLEXIBLE FLAT CABLE

(71) Applicant: Seong Cheol Joo, Pocheon-si (KR)

(72) Inventors: Seong Cheol Joo, Pocheon-si (KR); Yong Gil Son, Pocheon-si (KR)

(73) Assignee: Seong Cheol Joo, Gyeonggi-do (KR)

(*) Notice: Subject to any disclaimer, the term of this patent is extended or adjusted under 35 U.S.C. 154(b) by 253 days.

(21) Appl. No.: 17/155,108

(22) Filed: Jan. 22, 2021

(65) Prior Publication Data

US 2022/0238257 A1 Jul. 28, 2022

(51) Int. Cl.
*H01B 13/22* (2006.01)
*H05K 9/00* (2006.01)
*H01B 7/08* (2006.01)
*H01B 7/04* (2006.01)

(52) U.S. Cl.
CPC ............... *H01B 13/22* (2013.01); *H01B 7/04* (2013.01); *H01B 7/08* (2013.01); *H05K 9/0081* (2013.01)

(58) Field of Classification Search
CPC ............. H01B 13/22; H01B 7/04; H01B 7/08
See application file for complete search history.

(56) References Cited

FOREIGN PATENT DOCUMENTS

| JP | 1-175113 A | * | 7/1989 |
| JP | 2-41332 U | * | 3/1990 |
| KR | 101375975 B1 | | 4/2014 |

* cited by examiner

*Primary Examiner* — Jeffry H Aftergut
(74) *Attorney, Agent, or Firm* — Cantor Colburn LLP

(57) ABSTRACT

A method for wrapping an FFC is provided. The method includes: a step of removing release paper from a shielding tape which includes the release paper and adhesive paper; a step of aligning an FFC on an adhesive surface of the adhesive paper from which the release paper is removed; and a preliminary bending step.

10 Claims, 23 Drawing Sheets

METHOD AND APPARATUS FOR WRAPPING FLEXIBLE FLAT CABLE

BACKGROUND

1. Field

The present disclosure relates to a method and an apparatus for wrapping a flexible flat cable (FFC).

2. Description of the Related Art

Flexible flat cables (FFCs) are widely used in various fields due to their availability and economic feasibility of being able to be utilized in various electronic products and various industrial fields. For example, the FFCs are increasingly used in electronic device products such as printers or scanners.

FIG. 1 is a view to explain a well-known FFC. Referring to FIG. 1, the FFC 10 includes an area 13 through which a conductor wire is exposed (hereinafter, referred to as a "window").

The FFC needs to be shielded by a shielding tape to prevent interference by electromagnetic waves. FIG. 2 is a view to explain a well-known shielding tape. Referring to FIG. 2, the shielding tape 20 (hereinafter, referred to as a "tape") is formed with a material for shielding against electromagnetic waves, and includes release paper 21 and adhesive paper 22. An adhesive is coated over one surface of the adhesive paper 22, and the release paper 21 is detachably attached to one surface of the adhesive paper 22 over which the adhesive is coated. The release paper 21 is detached and then the adhesive paper 22 is used when the tape 20 is used.

For example, Korean Patent Registration No. 10-1375975 (hereinafter, referred to as '975' patent) discloses an apparatus for shielding an FFC by a tape. However, in '975 patent, the FFC is not completely shielded by 360 degrees and efficiency of shielding against electromagnetic waves may be degraded.

SUMMARY

According to an embodiment of the present disclosure, there are provided a method and an apparatus for wrapping an FFC, which have excellent efficiency of shieling against electromagnetic waves.

According to another embodiment of the present disclosure, there are provided a method and an apparatus for wrapping an FFC which can automatically produce an FFC having excellent electromagnetic wave shielding efficiency.

According to an embodiment of the present disclosure, a method for wrapping an FFC includes: a step of removing release paper from a shielding tape which includes the release paper and adhesive paper; a step of aligning an FFC on an adhesive surface of the adhesive paper from which the release paper is removed; and a preliminary bending step.

In the above-described FFC wrapping method, the adhesive paper may be a shielding member having a length and a width, and an adhesive may be coated over one surface of the adhesive paper and the one surface over which the adhesive is coated may include a center area and one pair of wings.

In the above-described FFC wrapping method, the step of aligning may include a step of aligning the FFC on the one surface over which the adhesive is coated, and the preliminary bending step may include a step of bending the one pair of wings toward the center area by a first angle.

The first angle may be an angle between the FFC and at least one wing.

According to another embodiment of the present disclosure, an apparatus for wrapping an FFC includes: an alignment part configured to align an FFC on an adhesive surface of adhesive paper from which release paper is removed; and a preliminary bending part configured to preliminarily bend the adhesive paper.

The adhesive paper may be a shielding member having a length and a width, an adhesive may be coated over one surface of the adhesive paper, and the one surface over which the adhesive is coated may include a center area and one pair of wings.

The preliminary bending part may include a first preliminary bending part having a first recess inclined by a first angle, and the one pair of wings may be bent by the first angle while passing through the first recess.

According to one or more embodiments of the present disclosure, an FFC having excellent electromagnetic wave shielding efficiency can be automatically produced. In particular, an FFC capable of shielding against electromagnetic waves omnidirectionally can be automatically produced.

BRIEF DESCRIPTION OF THE DRAWINGS

The above and/or other aspects of the present disclosure will be more apparent by describing certain exemplary embodiments of the present disclosure with reference to the accompanying drawings, in which.

DETAILED DESCRIPTION OF EMBODIMENTS

Exemplary embodiments will now be described more fully with reference to the accompanying drawings to clarify objects, other objects, features and advantages of the present disclosure. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the application to those of ordinary skill in the art. It will be understood that when an element is referred to as being "on" another element, the element may be directly on another element or there may be a third element therebetween.

Definition of Terms

In the detailed description, when a certain element (referred to as an 'element A') and another element (referred to as an 'element B') are referred to as being operatively connected (or coupled) with each other, the element A and the element B may be directly coupled with each other or may be physically coupled with each other by the medium of one or more other elements, or a result of an operation of the element A influences an operation of the element B, or a result of an operation of the element B influences an operation of the element A.

In the detailed description, phrase 'C and/or D' (herein, 'C' and 'D' refer to certain elements or certain operations) is used to refer to 'A', 'B', or 'A and B'. For example, phrase 'electric and/or magnetic' refers to 'electric', 'magnetic', or 'electric and magnetic'.

In the detailed description, term 'tape' refers to a shielding tape for blocking electromagnetic waves.

Figure 4:
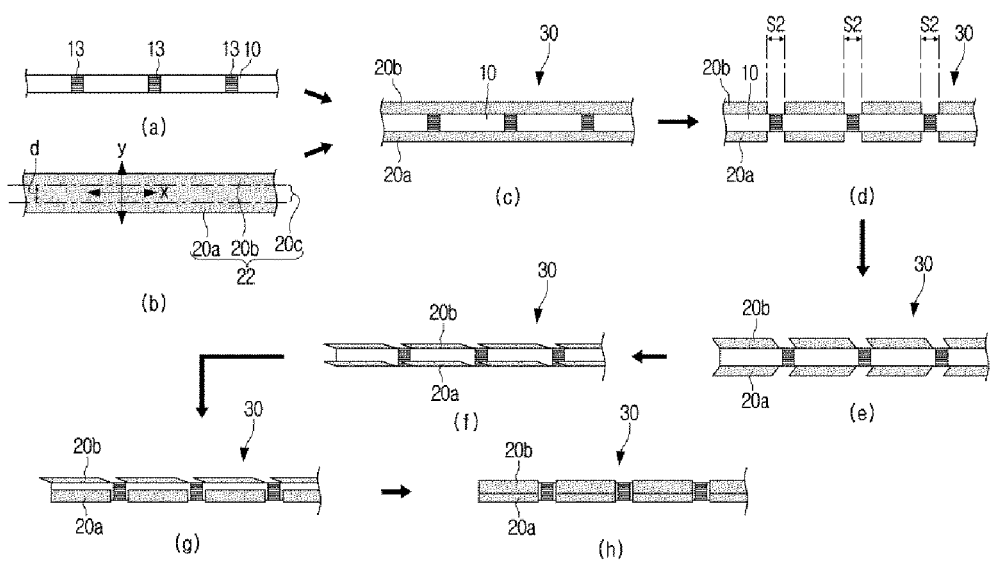
FIG. 4 are views to explain the concept of the present disclosure.

In the detailed description, term 'W-FFC' refers to an FFC that is wrapped with a shielding tape. In addition, in the detailed description, an FFC in a step (a) of FIG. 4 is referred to as an FFC 10, and an FFC in steps (c), (d), (e), (f), (g), and (h) of FIG. 4 is referred to as an FFC 30. An FFC in a step (h) of FIG. 4 is often referred to as an 'W-FFC'.

In the detailed description, terms 'adhesive paper' and 'adhesive surface' are given the same reference numeral 22 if there is no benefit in distinguishing between reference numerals.

The present disclosure relates to an 'FFC wrapping method' and/or an 'FFC wrapping apparatus'. Hereinafter, exemplary embodiments will be described in greater detail with reference to the accompanying drawings. The matters defined in the description, such as detailed construction and elements, are provided to assist in a comprehensive understanding of the exemplary embodiments. However, it is apparent that the exemplary embodiments can be carried out by those of ordinary skill in the art without those specifically defined matters. In the description of the exemplary embodiment, certain detailed explanations of related art are omitted when it is deemed that they may unnecessarily obscure the essence of the present disclosure.

Figure 3A:
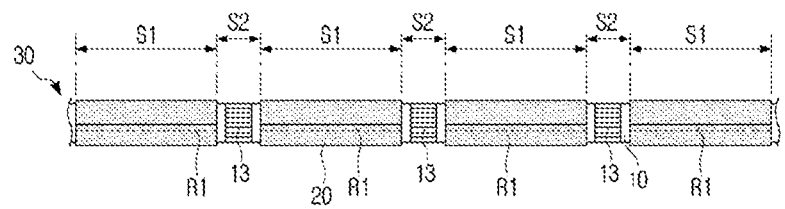
FIGS. 3A and 3B are views illustrating an W-FFC according to an embodiment of the present disclosure.
Figure 3B:
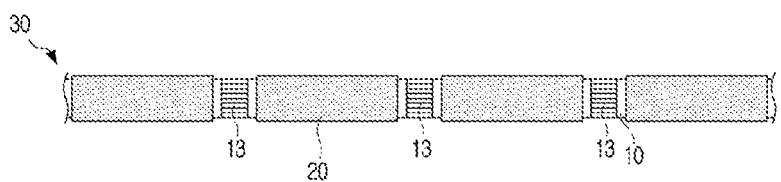

FIGS. 3A and 3B illustrate a W-FFC according to an embodiment of the present disclosure. Specifically, FIG. 3A illustrates a front surface of the W-FFC 30 and FIG. 3B illustrates a rear surface of the W-FFC 30.

Referring to FIGS. 3A and 3B, the W-FFC 30 according to an embodiment includes an attachment section S1 and a non-attachment section S2. The non-attachment section S2 is a section to which a tape 20 is not attached, and the attachment section S1 is a section to which the tape 20 is completely attached in 360-degree directions. The non-attachment section S2 is a section including a window 13 through which a conductor wire is exposed, and the tape 20 is formed with a material capable of shielding against electromagnetic waves generated in the FFC 10.

Referring to FIG. 3A, the tape 20 wraps the attachment section S1 by 360 degrees and has portions overlapping each other. In FIG. 3A, an overlapping area of the tape 20 is indicated by reference sign 'R1'.

FIG. 4 are views to explain the concept of the present disclosure, and FIGS. 5A, 5B, and 5C, FIGS. 22A, 22B, 22C, and 22D, and FIGS. 24A, 24B, 24C, and 24D are views to explain a process of bending wings 20a, 20b of adhesive paper 22.

Figure 5A:
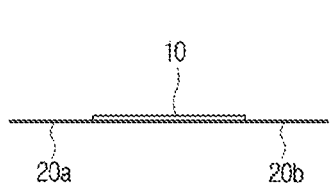
FIGS. 5A, 5B, and 5C are views to explain preliminary bending according to an embodiment of the present disclosure.
Figure 5B:
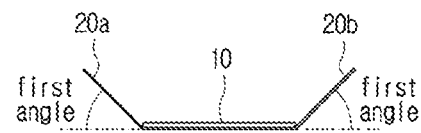
Figure 5C:
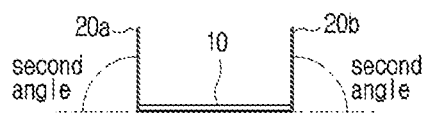

Referring to these drawings, the present disclosure includes a step of preparing the FFC 10 (step (a) of FIG. 4) and the adhesive paper 22 from which release paper 21 is removed (step (b) of FIG. 4), a step of aligning the FFC 10 on the adhesive paper 22 (step (c) of FIG. 4), a step of removing the adhesive paper 220 attached to the non-attachment section S2 (step (d) of FIG. 4 and FIG. 5A), a step of bending one pair of wings 20a, 20b of the adhesive paper 22 by a first angle (step (e) of FIG. 4 and FIG. 5B), a step of bending the one pair of wings 20a, 20b of the adhesive paper 22 by a second angle (step (f) of FIG. 4 and FIG. 5C), a step of bending any one wing 20a of the one pair of wings 20a, 20b of the adhesive paper 22 to be attached to the FFC 10 (step (g) of FIG. 4, and FIGS. 22A, 22B, 22C, and 22D), and a step of bending the other wing 20b of the one pair of wings 20a, 20b of the adhesive paper 22 to be attached to the FFC 10 (step (h) of FIG. 4, and FIGS. 24A, 24B, 24C, and 24D). The step of aligning the FFC 10 on the adhesive paper 22 and the step of removing the adhesive paper 22 attached to the non-attachment section S2 may be performed by, for example, an alignment part 300, which will be described below. The step of bending the one pair of wings 20a, 20b of the adhesive paper 22 by the first angle, and the step of bending the one pair of wings 20a, 20b of the adhesive paper 22 by the second angle may be performed by a preliminary bending part 100. The step of bending any one wing 20a of the pair of wings 20a, 20b of the adhesive paper 22 to be attached to the FFC 10, and the step of bending the other wing 20b of the one pair of wings 20a, 20b of the adhesive paper 22 to be attached to the FFC 10 may be performed by a main bending part 200. The above-described steps may be implemented by the FFC wrapping method and the FFC wrapping apparatus according to an embodiment of the present disclosure.

Figure 6:
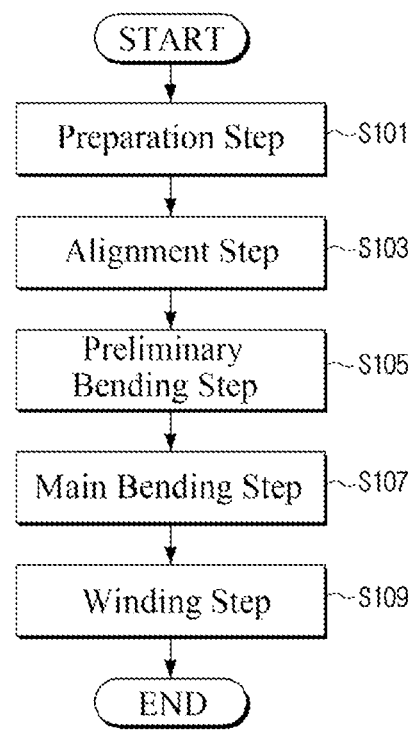
FIG. 6 is a view to explain a method for wrapping an FFC according to an embodiment of the present disclosure.

FIG. 6 is a view to explain the FFC wrapping method (hereinafter, referred to as the 'present method') according to an embodiment of the disclosure. Referring to FIG. 6, the present method may include a preparation step (S101), an alignment step of aligning the FFC on the adhesive paper (S103), a preliminary bending step (S105), a main bending step (S107), and a winding step (S109). Hereinafter, the present method will be described with reference to FIGS. 2 to 6. FIGS. 22A, 22B, 22C, and 22D and FIGS. 24A, 24B, 24C, and 24D.

The preparation step (S101) includes a step of preparing the adhesive paper 22 and a step of preparing the FFC 10. Herein, the adhesive paper 22 refers to the tape 10 from which the release paper 21 is removed.

The adhesive paper 22 used in the present method is a shielding member having a length and a width, and an adhesive is coated over one surface of the adhesive paper 22. One surface 22 coated with the adhesive (hereinafter, referred to as an 'adhesive surface') includes a center area 20c and one pair of wings 20a, 20b. The FFC 10 is positioned on the center area 20b along a longitudinal direction (x direction) of the adhesive paper 22.

The step of aligning the FFC 10 on the adhesive paper 22 (S103) includes a step of positioning the FFC 10 on the center area 20c of the adhesive paper 22 along the longitudinal direction (x direction) of the adhesive paper 22 (step (c) of FIG. 4), and a step of removing the adhesive paper attached to the non-attachment section (step (d) of FIG. 4).

The preliminary bending step (S105) may include a step of bending the one pair of wings 20a, 20b by the first angle in a direction toward the center area 20c (y direction). For example, at the preliminary bending step (S105), the wing 20a and the wing 20b may be bent by the first angle. Herein, the first angle refers to an angle formed by an imaginary extension surface of the FFC 10 of the center area 20c, and the wing 20a (or the wing 20b). Referring to FIG. 5B, the first angle is illustrated by way of an example. FIG. 5A illustrates a bending angle of the wing 20a, 20b when the FFC 10 in the step (d) of FIG. 4 is viewed from the x-axis direction, FIG. 5B illustrates a bending angle of the wing 20a, 20b when the FFC 30 in the step (e) of FIG. 4 is viewed from the axis direction, and FIG. 5C illustrates a bending angle of the wing 20a, 20b when the FFC 30 in the step (f) of FIG. 4 is viewed from the axis direction.

The first angle may be larger than 0 degree and may be smaller than the second angle. The first angle may be, for example, 45 degrees, but the present disclosure is not limited to the 45 degrees.

For example, the preliminary bending step (S105) may be implemented to bend the one pair of wings 20a, 20b by the first angle, simultaneously.

In another example, the preliminary bending step (S105) may be implemented to bend one of the one pair of wings 20a, 20b (for example, the wing 20a) by the first angle, and then, to bend the other wing (for example, the wing 20b) by the first angle.

The preliminary bending step (S105) may further include a step of bending the one pair of wings 20a, 20b bent by the first angle, toward the center area 20c by the second angle. Herein, the second angle refers to an angle that is formed by an imaginary extension surface of the FFC 10 and the wing 20a (or the wing 20b). In the present embodiment, the second angle may be larger than the first angle. The second angle may be 90 degrees, for example, but the present disclosure is not limited thereto. The step of bending by the second angle may be implemented to bend the one pair of wings 20a, 20b toward the center area 20c by the second angle, simultaneously, or to bend one of the one pair of wings 20a, 20b (for example, the wing 20a) by the second angle, first, and then, to bend the other wing (for example, the wing 20b) by the second angle. Referring to FIG. 5C, the second angle is illustrated by way of an example.

The main bending step (S107) may be a step of further bending the one pair of wings 20a, 20b bent by the first angle or the second angle at the preliminary bending step (S105) until the wings are attached to the FFC 10.

According to an embodiment, the main bending step (S107) may be implemented to bend the one pair of wings 20a, 20b, simultaneously, until the wings are attached to the FFC 10.

According to another embodiment, the main bending step (S107) may be implemented to bend the one pair of wings 20a, 20b in sequence until the wings are attached to the FFC 10. For example, the main bending step (S107) may include a first main bending step (FIGS. 22A, 22B, 22C, and 22D) of bending any one 20a of the one pair of wings 20a, 20b until the wing 20a comes into contact with the FFC 10, and a second main bending step (FIGS. 24A, 24B, 24C, and 24D) of bending the other wing 20b until the wing 20b comes into contact with the FFC 10. For example, the main bending step (S107) may be implemented to bend any one 20a of the one pair of wings 20a, 20b, first, in order as indicated in FIGS. 22A, 22B, 22C, and 22D, and to bend the other wing 20b in order as indicated in FIGS. 24A, 24B, 24C, and 24D. Angles θ11, θ12, θ13, θ14, θ21, θ22, θ23, θ24 shown in FIGS. 22A, 22B, 22C, and 22D and FIGS. 24A, 24B, 24C, and 24D refer to angles formed between the imaginary extension surface of the FFC 10 and the wing 20a (or the wing 20b). For example, θ11 and θ21 may be 100 degrees, θ12 and θ22 may be 120 degrees, θ13 and θ23 may be 150 degrees, and θ14 and θ24 may be 180 degrees. These numerical values are merely examples and the present disclosure is not limited thereto.

As shown in FIGS. 22A, 22B, 22C, and 22D, the first main bending step may be, for example, a step of bending the wing 20a by the third-1 angle (θ11), the third-2 angle (θ12), the third-3 angle (θ13), and the third-4 angle (θ14) in sequence until the wing 20a comes into contact with the FFC 10, and the second main bending step may be, for example, a step of bending the wing 20b by the fourth-1 angle (θ21), the fourth-2 angle (θ22), the fourth-3 angle (θ23), and the fourth-4 angle (θ24) in sequence until the angle 20b comes into contact with the FFC 10.

According to an embodiment, the third-1 angle, the third-2 angle, the third-3 angle, and the third-4 angle may be the same as the fourth-1 angle, the fourth-2 angle, the fourth-3 angle, and the fourth-4 angle, respectively. That is, the third-1 angle and the fourth-1 angle may be the same as each other, the third-2 angle and the fourth-2 angle may be the same as each other, the third-3 angle and the fourth-3 angle may be the same as each other, and the third-4 angle and the fourth-4 angle may be the same as each other.

The winding step (S109) is a step of winding the W-FFC 30 finished through the main bending step (S107) around a roller.

The present method may further include a step of removing the adhesive paper attached to the non-attachment section S2. Herein, the step of removing the adhesive paper may be implemented between the step of aligning the FFC 10 on the adhesive paper 22 (S103) and the preliminary bending step (S105).

Figure 7:
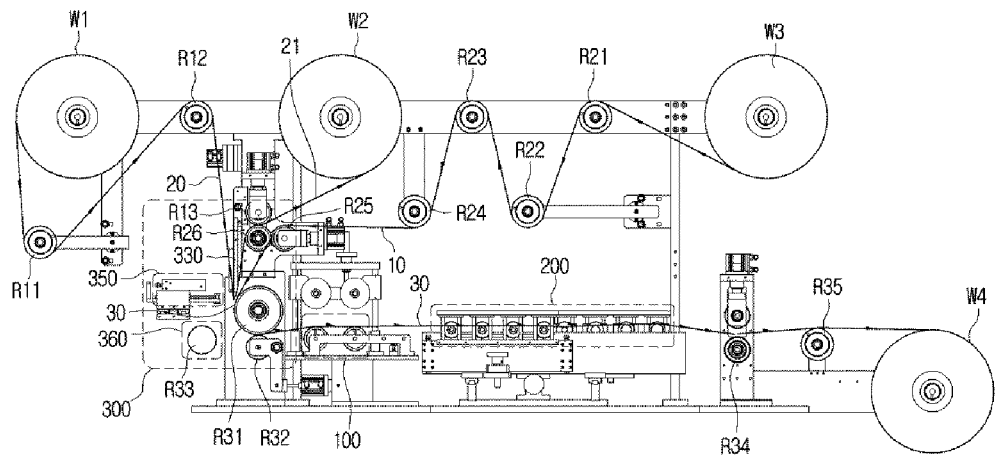
FIG. 7 is a view to explain an apparatus for wrapping an FFC according to an embodiment of the present disclosure.

FIG. 7 is a view to explain an FFC wrapping apparatus according to an embodiment of the present disclosure, and FIGS. 8 to 25 are views to explain exemplary embodiments regarding elements of the FFC wrapping apparatus of FIG. 7.

The FFC wrapping apparatus (hereinafter, referred to as the 'present apparatus') according to an embodiment of the present disclosure may be an example of an apparatus which implements the FFC wrapping method explained above with reference to FIGS. 2 to 6, and the present apparatus will be described by referring to FIGS. 7 to 28 simultaneously or separately.

Referring to FIG. 7, the apparatus according to an embodiment of the present disclosure may include a preliminary bending part 100, a main bending part 200, an alignment part 300, a plurality of rollers R11, R12, R13, R21, R22, R23, R24, R25, R26, R31, R32, R33, R34, R35, and a plurality of winders W1, W2, W3, W4. Herein, the plurality of rollers R11, R12, R13, R21, R22, R23, R24, R25, R26, R31, R32, R33, R34, R35 may be any one of active rollers and passive rollers. Herein, the active roller may refer to a roller that is rotated by a driving part such as a motor, and the passive roller may refer to an idle roller to support an FFC and/or a tape 20 and to convert a direction.

The present apparatus may further include a power part to supply power, a driving part to provide a driving force, a support part to physically support the respective elements, and a controller to electrically and/or magnetically transmit a signal and to control the respective elements, although they are not illustrated. Herein, the driving part may operate other elements (for example, rollers and winders) needed to be driven by using energy received from the power part, and the controller may control operations of the other elements. The elements that are not illustrated may be easily implemented by those skilled in the art and thus a detailed description thereof is omitted.

Adhesive paper 22 used in the present apparatus is the same as the adhesive paper 22 used in the above-described FFC wrapping method. That is, the adhesive paper 22 used in the present apparatus is a shielding member having a length and a width, and an adhesive may be coated over one surface of the adhesive paper 22. The adhesive surface 22 may include a center area 20c and one pair of wings 20a, 20b.

In the present apparatus, the preliminary bending step (S105) may be performed by the preliminary bending part 100, the main bending step (S107) may be performed by the main bending part 200, the step of aligning (S103) and the step of removing release paper 21 may be performed by the alignment part 300. In the present apparatus, the FFC 30 passing through the alignment part 300 may be in the state as shown in the step (d) of FIG. 4, the FFC 30 passing through the preliminary bending part 100 may be in the state as shown in the step (f) of FIG. 4 (or FIG. 5C), and the FFC 30 passing through the main bending part 200 may be in the state as shown in the step (h) of FIG. 4 (or FIG. 24D).

Referring to FIGS. 2, 3, 4, and 7, the tape 20 wound around the winder W1 is moved to the alignment part 300 through the rollers R11, R12. The alignment part 300 may remove the release paper 21 from the tape 20 and then may attach the tape to the FFC 10, and may remove the adhesive paper 22 attached to the non-attachment section S2 such that the adhesive paper 22 is attached only to the attachment section S1. The release paper 21 removed from the tape 20 is wound around the winder W2.

Referring to FIGS. 2, 3, 4, and 7, the FFC 10 wound around the winder W3 is moved to the alignment part 300 through the rollers R21, R22, R23, R24. The FFC 10 moved to the alignment part 300 is attached to the adhesive paper 22 by the alignment part 300 as described above, and then is moved to the preliminary bending part 100. The preliminary bending part 100 bends the one pair of wings 22a, 22b of the adhesive paper 22 by a predetermined angle to wrap the adhesive paper 22 (that is, in a direction toward the center area). Herein, the predetermined angle may be, for example, an angle by which the one pair of wings 22a, 22b do not come into contact with the adhesive paper 22, and for example, may be 90 degrees. The adhesive paper 22 the one pair of wings 22a, 22b of which are bent by the predetermined angle by the preliminary bending part 100 is moved to the main bending part 200. The one pair of wings 22a, 22b may be bent to completely wrap the FFC 10 at the main bending part 200.

The W-FFC 30 discharged from the main bending part 200 is wound around the winder S4 through the rollers R34, R35.

Figure 8:
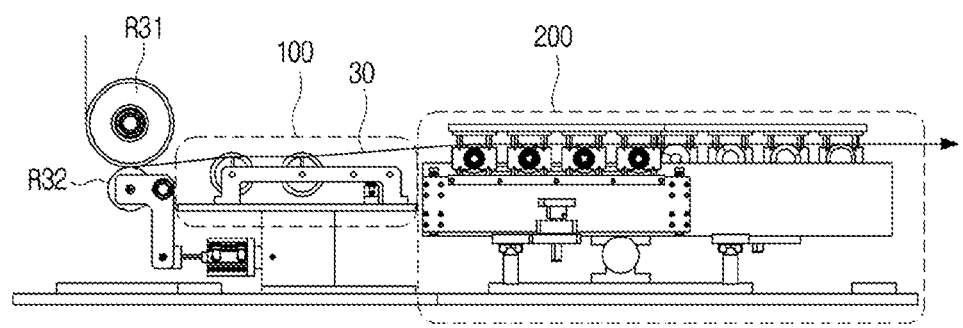
FIGS. 8 and 9 are views illustrating a preliminary bending part and a main bending part according to an embodiment of the present disclosure.
Figure 9:
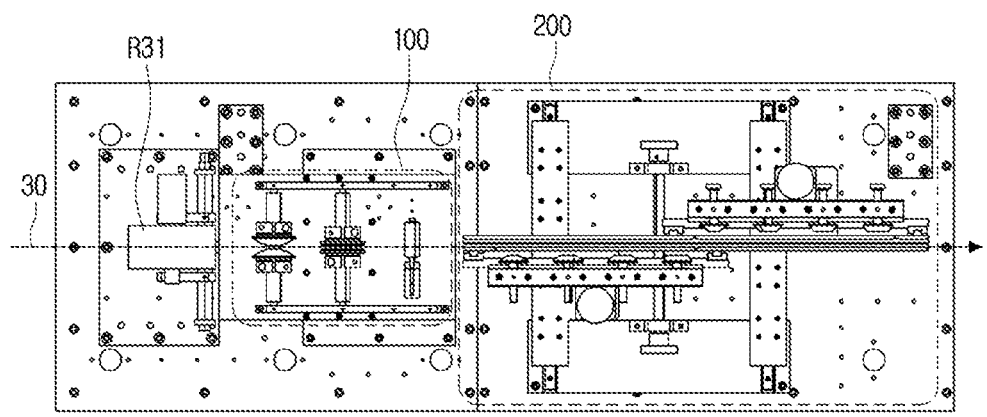
Figure 10:
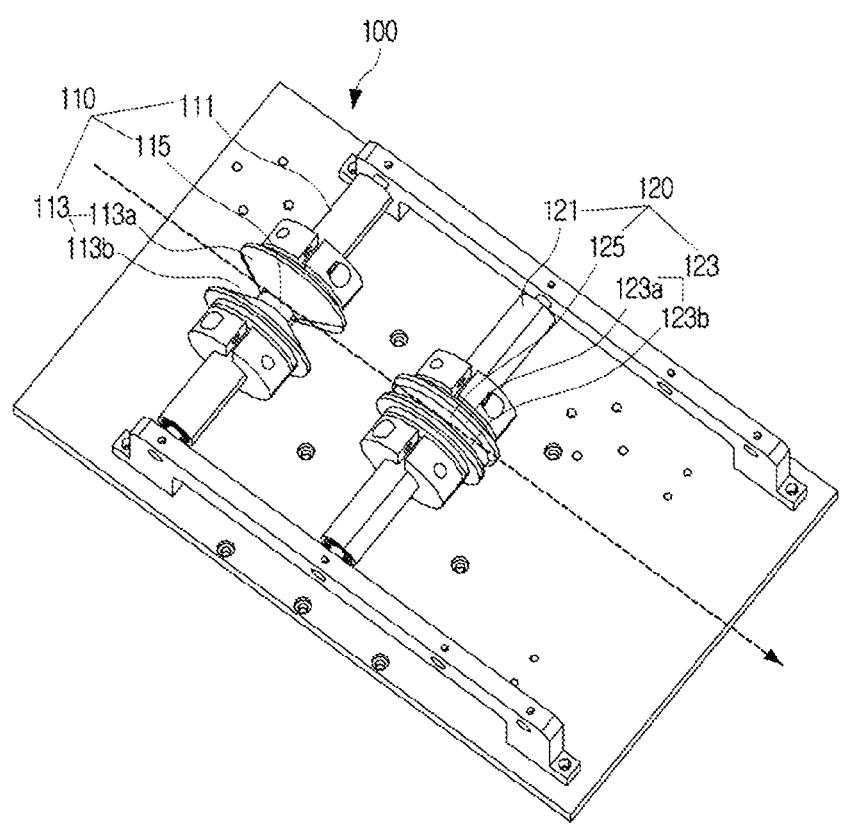
FIGS. 10 to 16 are views illustrating the preliminary bending part according to an embodiment of the present disclosure.
Figure 11:
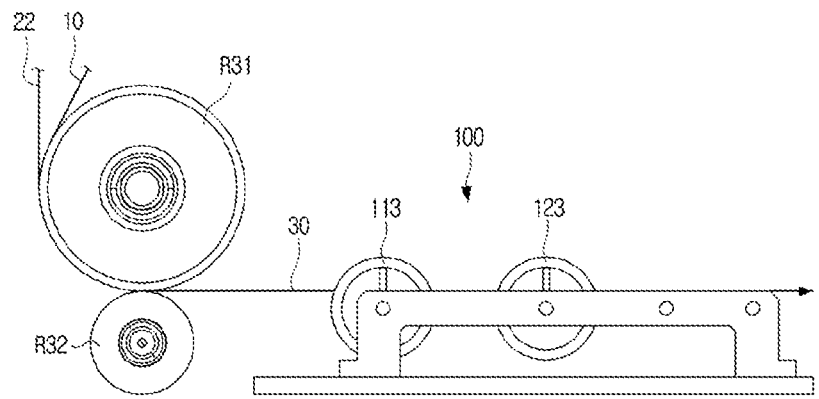

FIGS. 8 and 9 are views illustrating the preliminary bending part 100 and the main bending part 200 according to an embodiment of the present disclosure, and FIGS. 10 to 16 are views to explain the preliminary bending part 100 according to an embodiment of the present disclosure. Hereinafter, the bending part according to an embodiment of the present disclosure will be described by referring to FIGS. 8 to 16 simultaneously or separately.

Referring to FIGS. 8 and 9, the preliminary bending part 100 may be positioned between the alignment part 300 and the main bending part 200, and may be operatively coupled with the alignment part 300 and the main bending part 200. That is, the FFC 30 discharged from the alignment part 300 is moved to the preliminary bending part 100, the FFC 30 bent by a predetermined angle by the preliminary bending part 100 is discharged to the main bending part 200, and the operation of bending the FFC 30 is completed by the main bending part 200.

Referring to FIG. 4, FIGS. 5A to 5C, and FIGS. 8 to 16, the preliminary bending part 100 bends the one pair of wings of the adhesive paper 22 by a predetermined angle to wrap the FFC 10. For example, the preliminary bending part 100 bends the one pair of wings 20a, 20b by 90 degrees. In another example, the preliminary bending part 100 may bend the one pair of wings 20a, 20b by a certain angle (an angle smaller than 90 degrees) (for example, 45 degrees), first (FIG. 5B), and may further bend the one pair of wings 20a, 20b to have the angle of 90 degrees (FIG. 5C).

According to an embodiment, the preliminary bending part 100 may include a first preliminary bending part 110 and a second preliminary bending part 120. The first preliminary bending part 110 may have a cylindrical body (hereinafter, referred to as a 'first body') 111 and a recess inclined by a first angle (hereinafter, referred to as a 'first recess') H1, and the second preliminary bending part 120 may have a cylindrical body (hereinafter, referred to as a 'second body') 121 and a recess inclined by a second angle (hereinafter, referred to as a 'second recess') H2. While the FFC 30 passes through the first recess H1, the one pair of wings 20a, 20b are bent by the first angle, and while the FFC 30 passes through the second recess H2, the one pair of wings 20a, 20b are bent by the second angle. Herein, the first angle may be, for example, 45 degrees, and the second angle may be 90 degrees.

The first recess H1 may be formed on the first body 111, and may be formed by a flat surface (hereinafter, referred to as a 'first flat surface') 115 and one pair of inclined surfaces (hereinafter, referred to as 'first inclined surfaces') 113 (113a, 113b), and the one pair of first inclined surfaces 113 may be connected by the first flat surface 115. That is, the first flat surface 115 is positioned between the one pair of first inclined surfaces 113.

The second recess H2 may be formed on the second body 121, and may be formed by a flat surface (hereinafter, referred to as a 'second flat surface') 125, and one pair of inclined surfaces (hereinafter, referred to as 'second inclined surfaces') 123 (123a, 123b), and the one pair of inclined surfaces 123 may be connected with each other by the second flat surface 125. That is, the second flat surface 125 is positioned between the one pair of second inclined surfaces 123.

Figure 12:
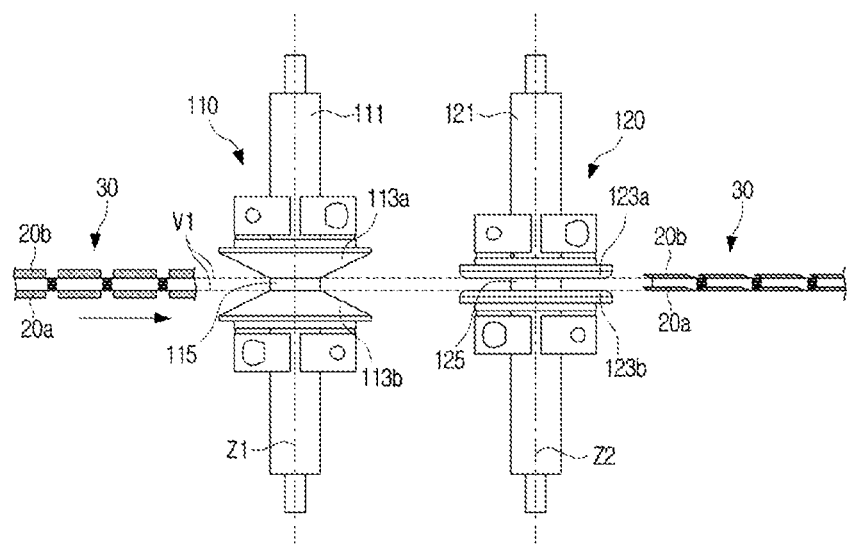
Figure 13:
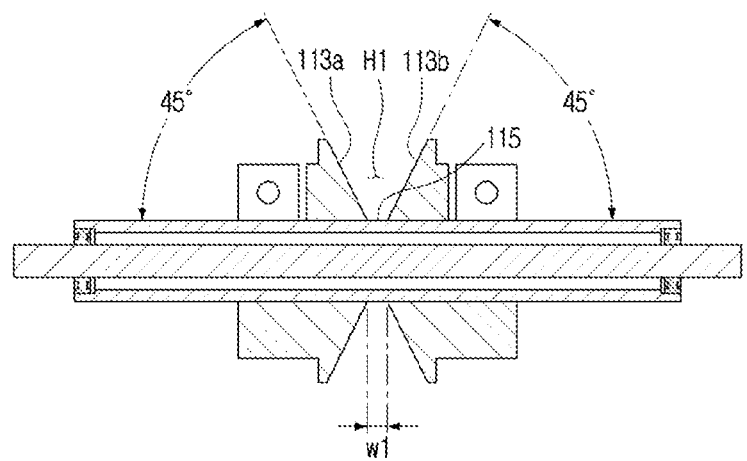

In the present embodiment, a width d of the center area of the adhesive paper 22, a width W1 of the first flat surface 115, and a width W2 of the second flat surface are the same as one another (see step (b) of FIG. 4, FIG. 12, and FIG. 13). Due to this configuration, the center area 20c of the adhesive paper 22 is not bent and only the one pair of wings 20a, 20b are bent.

Referring to FIG. 12 particularly, the FFC 30 passes through the first recess H1 of the first preliminary bending part 110, and the one pair of wings 20a, 20b are bent by the first angle (for example, 45 degrees) in a direction of wrapping the adhesive paper 22 (that is, in a direction toward the center area 20c of the adhesive paper 22), first. Thereafter, the FFC 30 passes through the second recess H2 of the second preliminary bending part 120, and the one pair of wings 20a, 20b are bent by the second angle (for example, 90 degrees) in a direction of wrapping the FFC 10 (that is, in a direction toward the center area 20c of the adhesive paper 22).

Referring to FIG. 13, the first recess H1 of the first preliminary bending part 110 is inclined by the first angle by way of an example. Herein, the first angle is an angle between the first flat surface 115 and the first inclined surface 113, and for example, the first angle may be 45 degrees. The first angle may be an angle that is larger than 0 degree and smaller than 90 degrees. When the FFC 30 passes through the first recess H1 inclined by the first angle, the one pair of wings 20a, 20b of the adhesive paper 22 are bent by the first angle.

Figure 14:
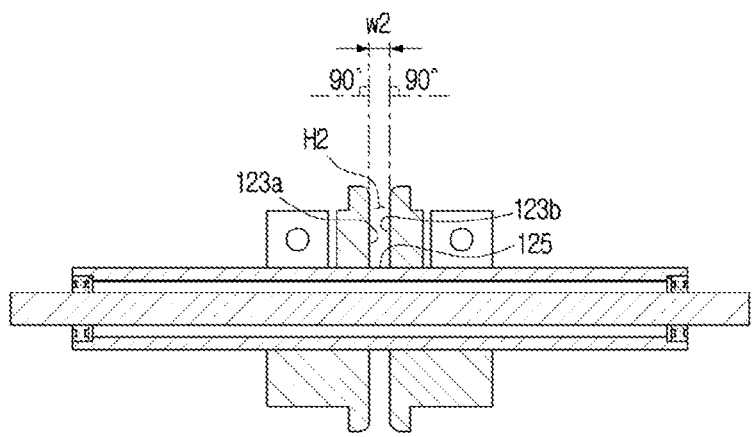
Figure 15:
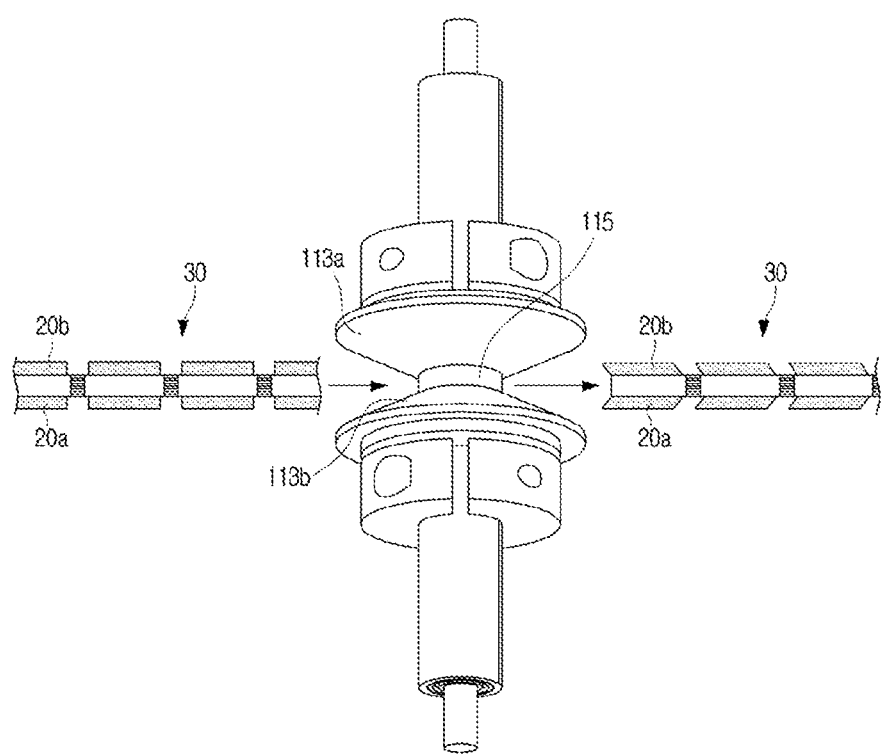
Figure 16:
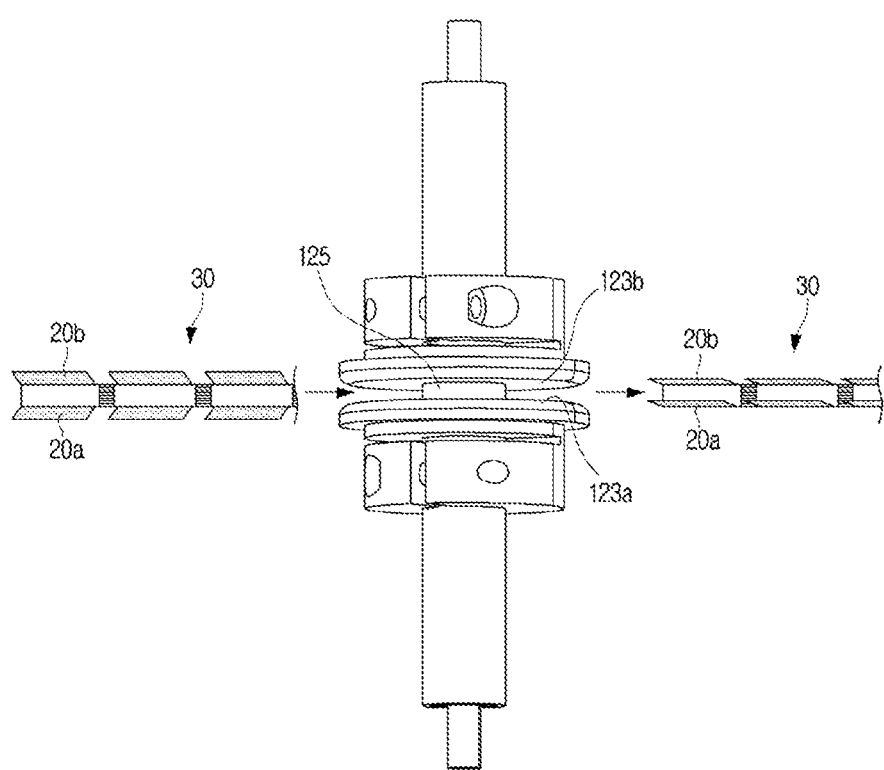
Figure 17:
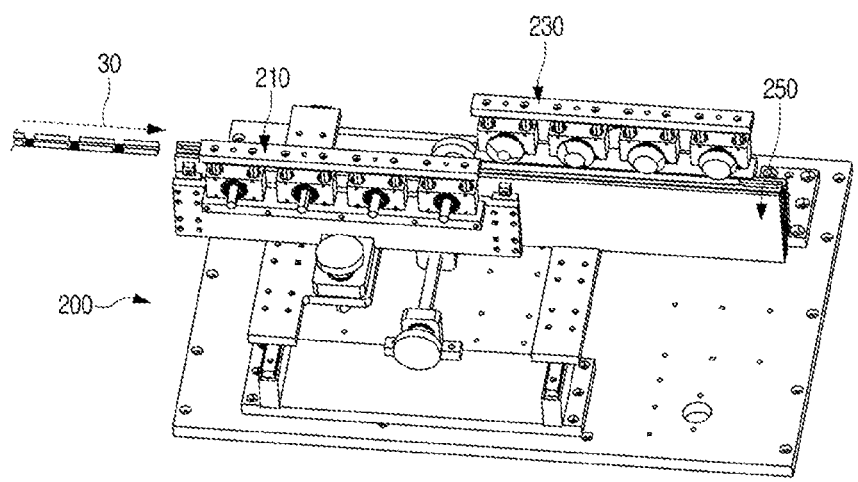
FIGS. 17 to 25 are views illustrating the main bending part according to an embodiment of the present disclosure.
Figure 18:
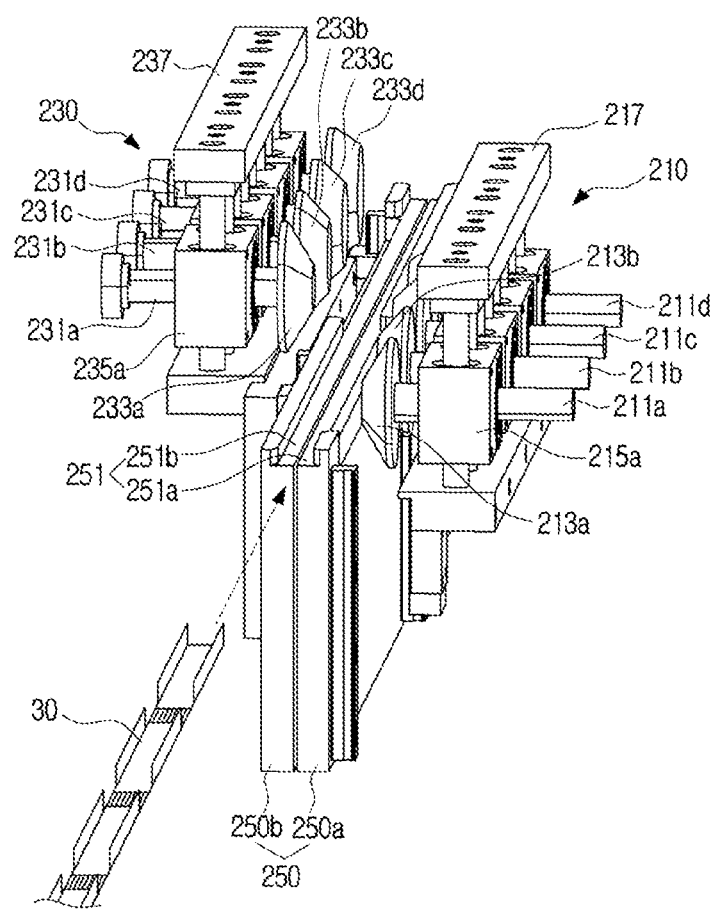
Figure 19:
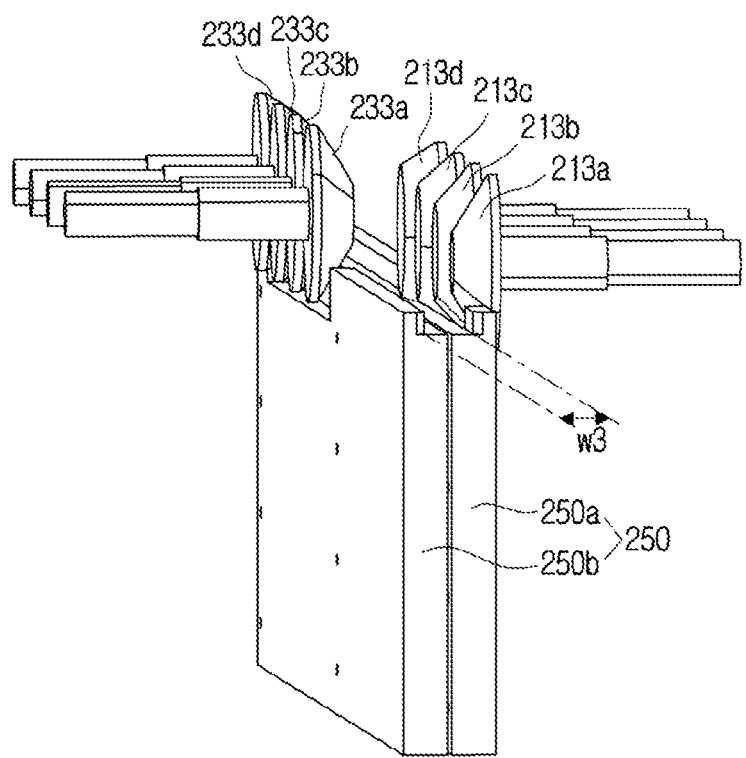
Figure 20:
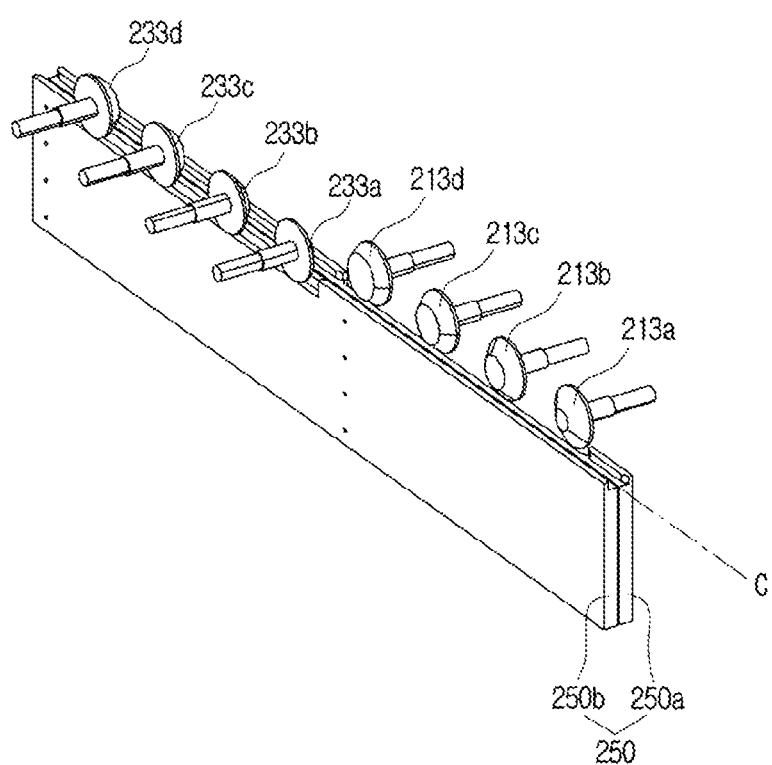

Referring to FIG. 14, the second recess H2 of the second preliminary bending part 120 is inclined by the second angle by way of an example. Herein, the second angle is an angle between the second flat surface 125 and the second inclined surface 123. The second angle may be, for example, 90 degrees. The second angle may be larger than the first angle and may be less than or equal to 180 degrees. When the FFC 30 passes through the second recess H2 inclined by the second angle, the one pair of wings 20a, 20b of the adhesive paper 22 are bent by the second angle.

FIGS. 17 to 25 are views to explain the main bending part according to an embodiment of the present disclosure.

Referring to these drawings and FIG. 4, the main bending part 200 may include a support part 250, a first main bending part 210, and a second main bending part 230. The support part 250 may be operatively coupled with the first main bending part 210, and also may be operatively coupled with the second main bending part 230.

The support part 250 and the first main bending part 210 bend any one (the wing 20a) of the one pair of wings 20a, 20b of the adhesive paper 22 to completely wrap the FFC 10. In addition, the support part 250 and the second main bending part 230 bend the other wing (wing 20b) of the one pair of wings 20a, 20b of the adhesive paper 22 to completely wrap the FFC 10.

The FFC 30 is supported by the support part 250. The support part 250 may include a first support part 250a and a second support part 250b, and the first support part 250a and the second support part 250b are coupled with each other to form a recess 256 to allow the FFC 30 to be moved therethrough. While the FFC 30 is moved through the recess 256, any one (for example, the wing 20a) of the one pair of wings 20a, 20b is bent by the first main bending part 210 in order until the wing 20a comes into contact with the FFC 10 and wraps the FFC 10.

The support part 250 includes a flat surface (hereinafter, referred to as a 'third flat surface') 251 (251a, 251b) on which the FFC 30 is positioned. The third flat surface 251 includes a flat surface (hereinafter, referred to as a 'third-1 flat surface') 251a formed on the first support part 250a, and a flat surface (hereinafter, referred to as a 'third-2 flat surface') 251b formed on the second support part 250b. In the present embodiment, a width W3 of the third flat surface 251 is the same as the width d of the center area 20c of the adhesive paper 22.

Figure 21:
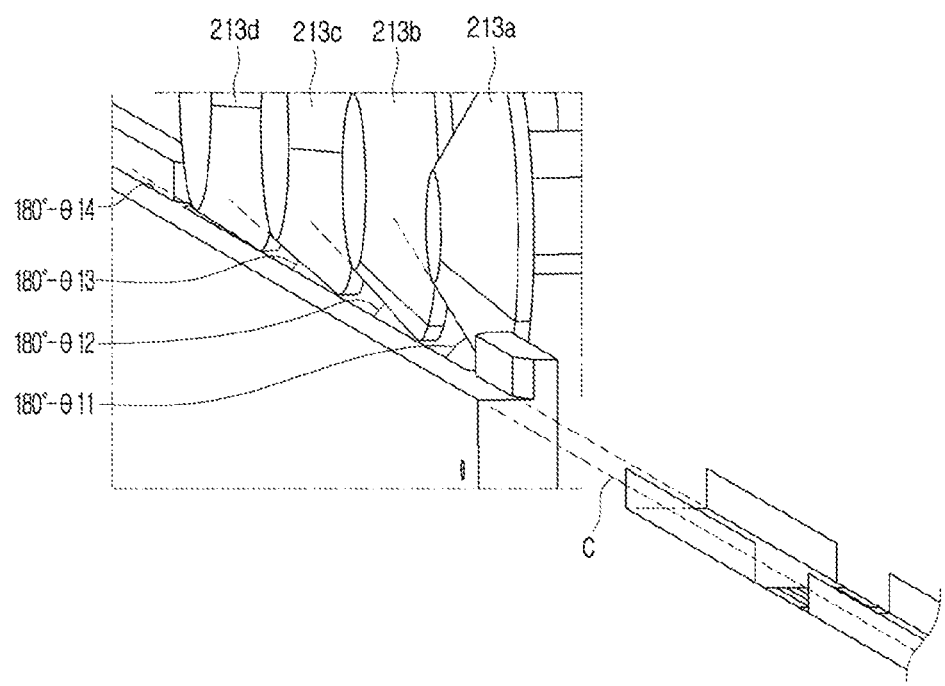
Figure 22A:
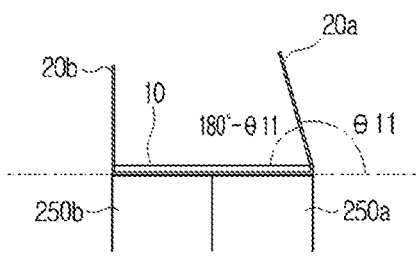
Figure 22B:
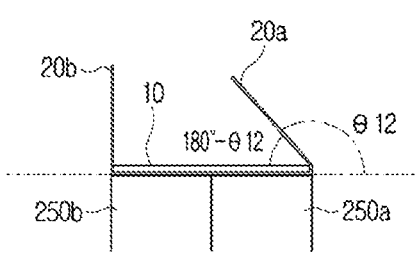
Figure 22C:
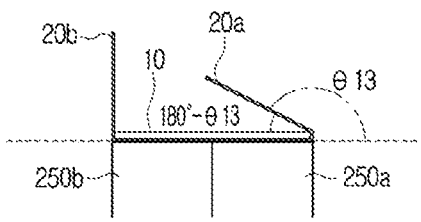
Figure 22D:
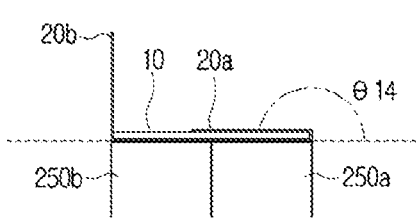
Figure 23:
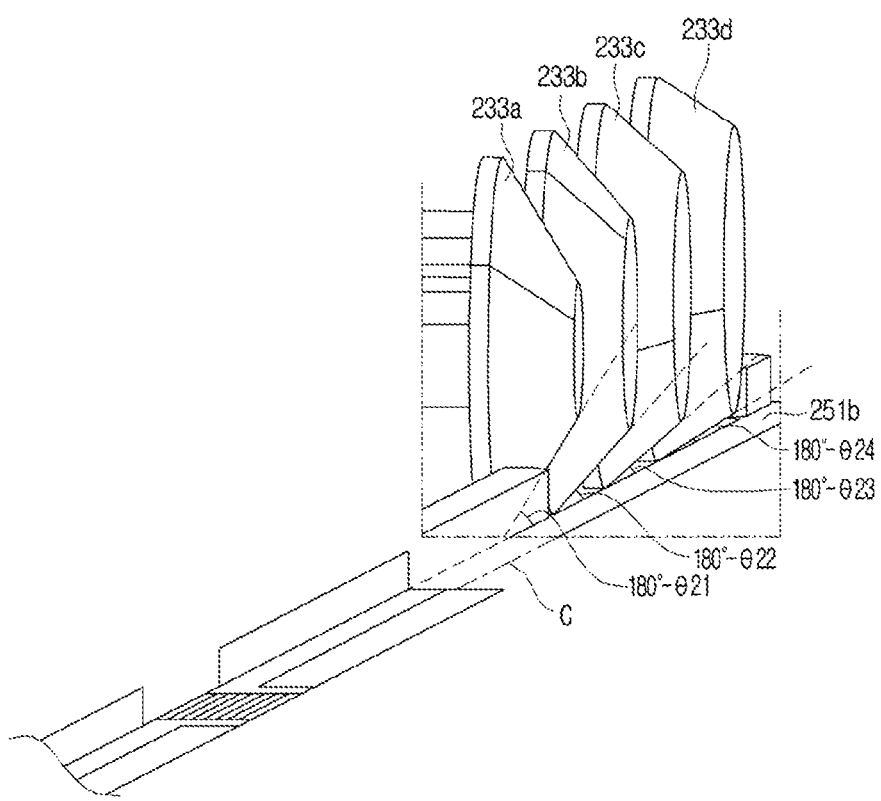
Figure 24A:
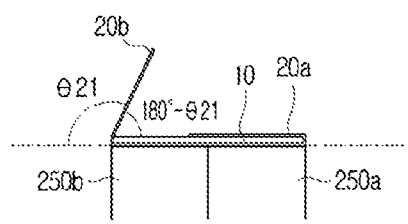
Figure 24B:
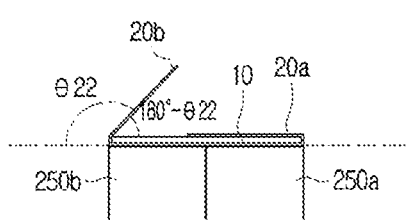
Figure 24C:
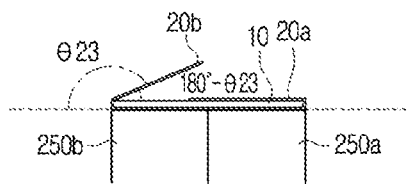
Figure 24D:
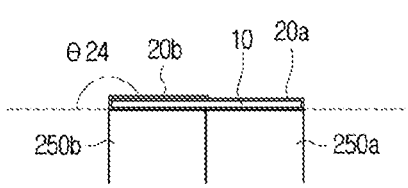
Figure 25:
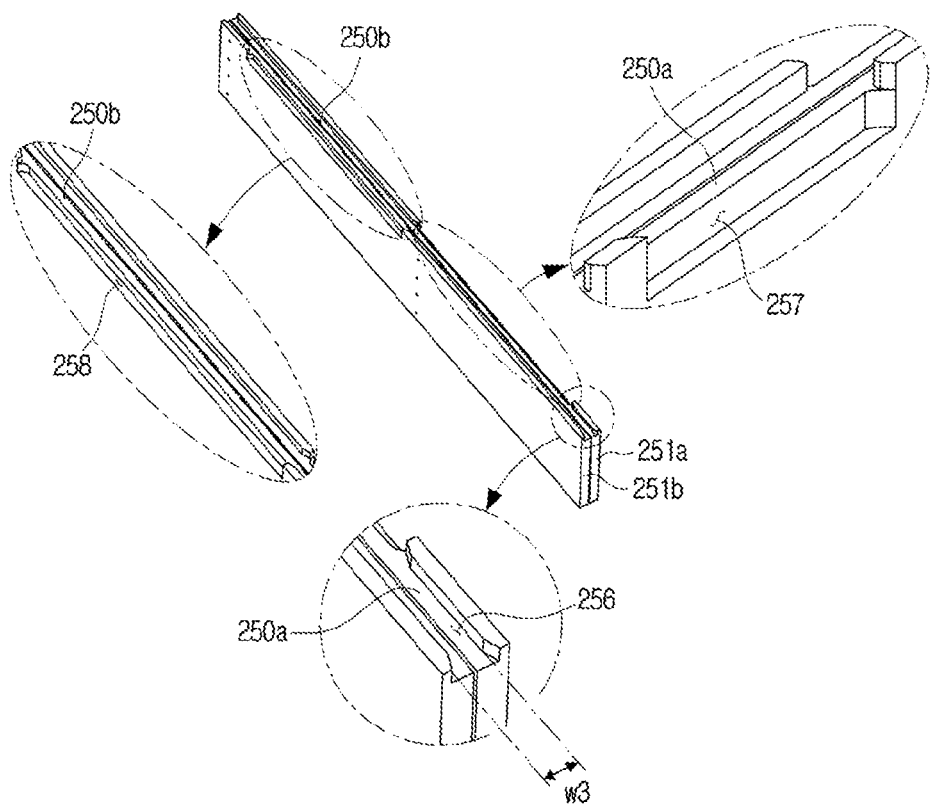

Referring to FIGS. 21, 23, and 25 particularly, the support part 250 includes a first opening 257 in which first heads 213a, 213b, 213c, 213d, which will be described below, are positioned, and a second opening 258 in which second heads 233a, 233b, 233c, 233d are positioned. The first opening 257 is formed adjacent to the third-1 flat surface 251a and the second opening 258 is formed adjacent to the third-2 flat surface 251b.

At the second main bending part 230, the other wing 20a of the one pair of wings 20a, 20b is bent until the other wing 20a completely wraps the FFC 10.

For example, the first main bending part 210 is configured to bend the wing 20a in order of FIGS. 22A, 22B, 22C, 22D. According to an embodiment, the first main bending part 210 includes a plurality of inclined heads ('first heads') 213 (213a, 213b, 213c, 213d), and respective inclination angles of the first heads 213a, 213b, 213c, 213d are different from one another. In addition, the second main bending part 230 includes a plurality of inclined heads ('second heads') 233 (233a, 233b, 233c, 233d), and respective inclination angles of the second heads 233a, 233b, 233c, 233d are different from one another.

Referring to FIGS. 21 to 25, the first heads 213a, 213b, 213c, 213d are inclined by predetermined angles with respect to the third-1 flat surface 251a. The first heads 213a, 213b, 213c, 213d may include the first-1 head 213a, the first-2 head 213b, the first-3 head 213c, and the first-4 head 213d. Each of the first heads 213a, 213b, 213c, 213d may be inclined by a predetermined angle with respect to the third-1 flat surface 251a. For example, the first-1 head 213a may be inclined by an angle of 180−θ11, the first-2 head 213b may be inclined by an angle of 180−θ12, the first-3 head 213c may be inclined by an angle of 180−θ13, and the first-4 head 213d may be inclined by an angle of 180−θ14. These angles are different from one another, and are gradually smaller in order of the angle of 180−θ11, the angle of 180−θ12, the angle of 180−θ13, and the angle of 180−θ14. That is, the first-2 head 213b is inclined to be closer to the third-1 flat surface 215a than the first-1 head 213a, the first-3 head 213c is inclined to be closer to the third-1 flat surface 215a than the first-2 head 213b, and the first-4 head 213d is inclined to be closer to the third-1 flat surface 215a than the first-3 head 213c. Accordingly, the wing 20a of the adhesive paper 22 is bent to be closer to the FFC 10 sequentially by the first-1 head 213a, the first-2 head 213b, the first-3 head 213c, and the first-4 head 213d, and the wing 20a is attached to completely wrap the FFC 10 by the first-4 head 213d. In this way, the wing 20a is bent sequentially by the first heads inclined by different angles.

The other wing 20b is bent in the same way. Referring to FIGS. 21 to 25, the second heads 233a, 233b, 233c, 233d are inclined by predetermined angles with respect to the third-2 flat surface 251b. The second heads 233a, 233b, 233c, 233d may include the second-1 head 233a, the second-2 head 233b, the second-3 head 233c, and the second-4 head 233d. Each of the second heads 233a, 233b, 233c, 233d may be inclined by a predetermined angle with respect to the third-2 flat surface 251b. For example, the second-1 head 223a may be inclined by an angle of 180−θ21, the second-2 head 233b may be inclined by an angle of 180−θ22, the second-3 head 233c may be inclined by an angle of 180−θ23, and the second-4 head 233d may be inclined by an angle of 180−θ24. These angles are different from one another, and are gradually smaller in order of the angle of 180−θ21, the angle of 180−θ22, the angle of 180−θ23, and the angle of 180−θ24. That is, the second-2 head 233b is inclined to be closer to the third-2 flat surface 215b than the second-1 head 233a, the second-3 head 233c is inclined to be closer to the third-2 flat surface 215b than the second-2 head 233b, and the second-4 head 233d is inclined to be closer to the third-2 flat surface 215b than the second-3 head 233c. Accordingly, the other wing 20b is bent to be closer to the FFC 10 sequentially by the second-1 head 233a, the second-2 head 233b, the second-3 head 233c, and the second-4 head 233d, and the wing 20b is attached to completely wrap the FFC 10 by the second-4 head 233d. In this way, the wing 20b is bent sequentially by the second heads inclined by different angles.

Referring to FIGS. 23 to 25, the second heads are inclined by predetermined angles with respect to the third flat surface. The second heads may include the second-1 head, the second-2 head, the second-3 head, and the second-4 head. The second heads are inclined by predetermined angles with respect to the first flat surface. For example, the second-1 head is inclined by an angle θ21, the second-2 head is inclined by an angle θ22, the second-3 head is inclined by an angle θ23, and the second-4 head is inclined by an angle θ24. These angles are different from one another, and are gradually smaller in order of the angle θ21, the angle θ22, the angle θ23, and the angle θ24. That is, the second-2 head is inclined to be closer to the flat surface than the second-1 head, the second-3 head is inclined to be closer to the flat surface than the second-2 head, and the second-4 head is inclined to be closer to the flat surface than the second-3 head. Accordingly, the wing of the adhesive layer is bent to be closer to the FFC sequentially by the second-1 head, the second-2 head, the second-3 head, and the second-4 head, and the wing of the adhesive paper is finally attached to the FFC by the second-4 head.

In the above-described embodiments, numerical values (for example, the number or angles of the heads) are merely examples, and the present disclosure is not limited to those numbers or angles described above, and changes can be made thereto without departing from the sprits of the present disclosure.

Figure 26:
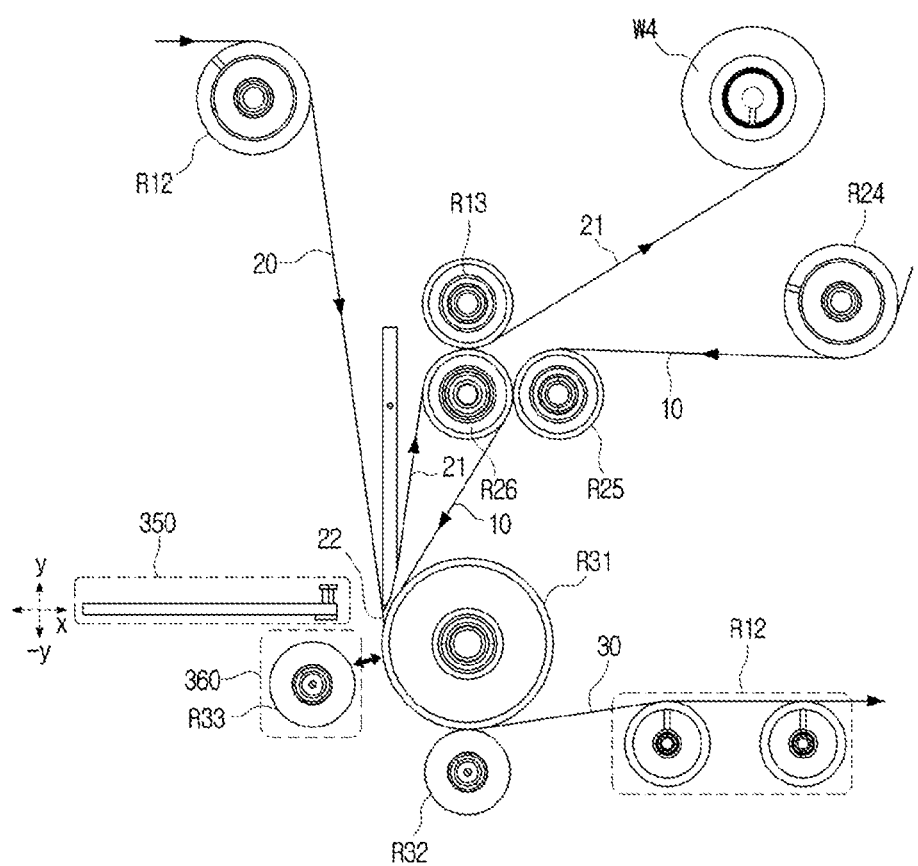
FIGS. 26 to 28 are views illustrating an alignment part according to an embodiment of the present disclosure.
Figure 27:
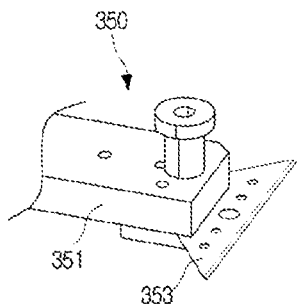
Figure 28:
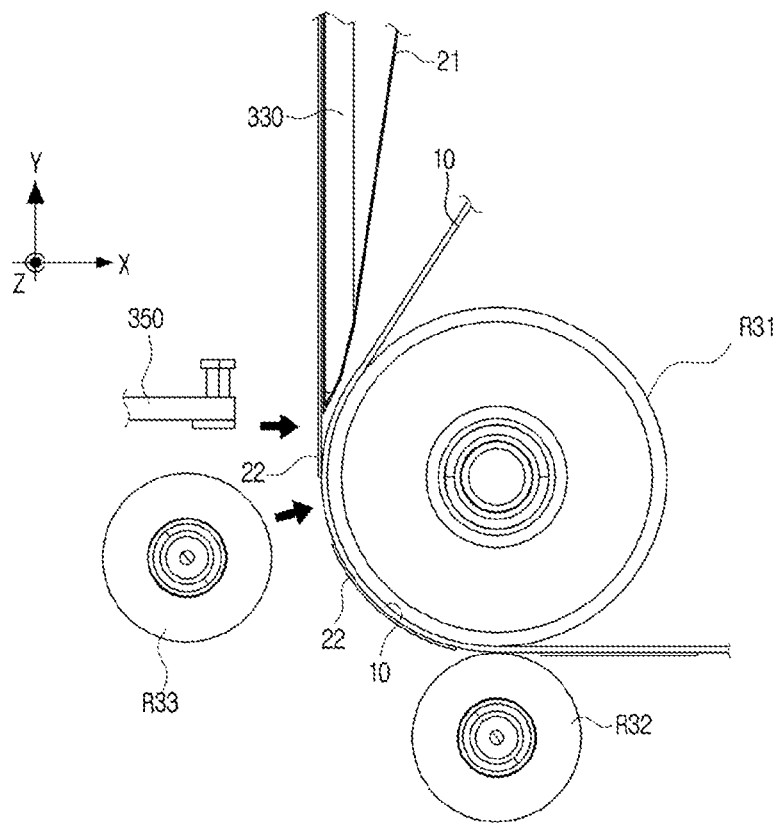

FIGS. 26 to 28 are views to explain the alignment part according to an embodiment of the present disclosure.

Figure 1:
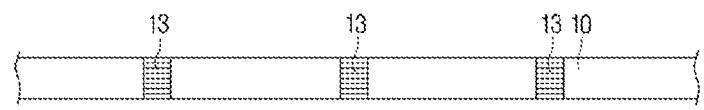
FIG. 1 is a view to explain a well-known FFC.
Figure 2:
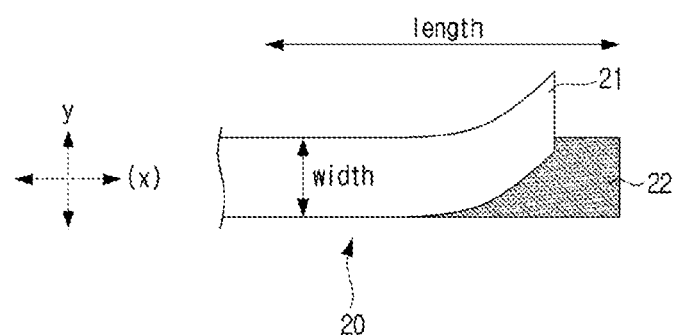
FIG. 2 is a view to explain a well-known shielding tape.

Referring to these drawings and FIG. 2, the alignment part 300 according to an embodiment of the present disclosure may include a cutting part 350, a release paper removal part 330, a pressing part 360, and a plurality of rollers R13, R25, R26, R31, R32.

The cutting part 350 may remove a portion of the adhesive paper 22 attached to the FFC 30. Specifically, the adhesive paper 22 existing on the non-attachment section S2 in the FFC 30 is cut out.

The release paper removal part 330 detaches the release paper 21 from the tape 20. The detached release paper is wound around the winder S2 through the rollers R26, R13.

The pressing part 360 attaches the adhesive paper 22 to the FFC 10 wound around the roller R31 by pressing the adhesive paper 22 toward the roller R31. When the adhesive paper 22 is cut out by the cutting part 350, the pressing part 360 attaches the adhesive paper 22 to the FFC 10 rotating by the roller 31 by pressing the adhesive paper 22 after a predetermined time is elapsed. Herein, the predetermined time is for avoiding attachment of the adhesive paper 22 to the non-attachment section S2.

Referring to FIGS. 26 and 27, the cutting part 350 may move forward or backward in the x-axis direction, and the present apparatus may further include an operating part (not shown) to move the cutting part 250 forward in the x-axis direction (in a direction of being closer to the FFC 10 to cut the FFC 10), or to move backward (in a direction of being far away from the FFC 10). The cutting part 350 includes a cutter 353 to cut the FFC 10 and a body 351 to fix the cutter 353. The body 351 may move forward or backward by an operating part (not shown).

The tape 20 moved to the alignment part 300 through the roller R12 has the release paper 21 removed by the release paper removal part 330 (that is, as the adhesive paper 22), and is moved in a vertical downward direction (−y axis direction) of the release paper removal part 330. The adhesive paper 22 moved in the vertical downward direction is pressed and attached to the FFC 10, which is being moved while being wound around the roller R31, by the pressing part 360. The cutting part 350 cuts out the adhesive paper 22 which is being pressed and attached to the FFC 10. Herein, a cutting position may be, for example, a position where the release paper 21 and the adhesive paper 22 are detached from each other by the release paper removal part 330.

The pressing part 360 may include the roller R33 rotatable in engagement with the roller R31. The roller R33 is rotated in engagement with the roller R31 when the adhesive paper 22 is attached to the FFC 10, and, when such an attachment operation is completed, the roller R33 is spaced apart from the roller R31 by a predetermined distance.

That is, the roller R33 is moved to the roller R31 and is rotated in engagement with the roller R31, such that the adhesive paper 22 is attached to the FFC 10 wound around the roller R31. When such an attachment operation is finished, the roller R33 is spaced apart from the roller R31 by a predetermined distance, and, when a predetermined time is elapsed, the adhesive paper 22 is attached to the FFC 10 wound around the roller R31 again.

The present apparatus may further include an operating part (not shown) to move the roller R33. The driving part may be appropriately implemented by those skilled in the art, and thus a detailed description thereof is omitted.

In the embodiments described above with reference to FIGS. 2 to 28, features of elements that are illustrated in the drawings, but are not explained in the detailed description of the present application are incorporated as a part of the detailed description if the features can be understood by those skilled in the art from the drawings.

While the present disclosure has been shown and described with reference to certain preferred embodiments thereof, it will be understood by those skilled in the art that various changes in form and details may be made therein without departing from the spirit and scope of the present disclosure as defined by the appended claims. Therefore, the scope of the present disclosure is defined not by the detailed descriptions of the present disclosure but by the appended claims, and all differences within the scope will be construed as being included in the present disclosure.

What is claimed is:

1. A method for wrapping an FFC, the method comprising:
   a step of removing release paper from a shielding tape which comprises the release paper and adhesive paper;
   a step of aligning an FFC on an adhesive surface of the adhesive paper from which the release paper is removed; and
   a preliminary bending step,
   wherein the adhesive paper is a shielding member having a length and a width, and an adhesive is coated over one surface of the adhesive paper and the one surface over which the adhesive is coated comprises a center area and one pair of wings,
   wherein the step of aligning comprises a step of aligning the FFC on the one surface over which the adhesive is coated,
   wherein the preliminary bending step comprises a step of bending the one pair of wings toward the center area by a first angle, the first angle being an angle between the FFC and at least one wing.

2. The method of claim 1, further comprising a main bending step,
   wherein the main bending step comprises a step of bending the one pair of wings until the one pair of wings bent at the preliminary bending step are attached to the FFC.

3. The method of claim 2, wherein the step of aligning comprises a step of aligning the FFC on the center area of the adhesive paper along a longitudinal direction of the adhesive paper.

4. The method of claim 3, wherein the preliminary bending step further comprises a step of bending the one pair of wings bent by the first angle toward the center area by a second angle, the second angle being an angle between the FFC and the at least one wing, the second angle being larger than the first angle.

5. The method of claim 4, wherein the main bending step comprises a step of bending any one of the one pair of wings of the adhesive paper sequentially until the one wing comes into contact with the center area, and bending the other wing of the one pair of wings of the adhesive paper sequentially until the other wing comes into contact with the center area.

6. An apparatus for wrapping an FFC, the apparatus comprising:
   an alignment part configured to align an FFC on an adhesive surface of adhesive paper from which release paper is removed; and
   a preliminary bending part configured to preliminarily bend the adhesive paper,
   wherein the adhesive paper is a shielding member having a length and a width, an adhesive is coated over one surface of the adhesive paper, and the one surface over which the adhesive is coated comprises a center area and one pair of wings,
   wherein the preliminary bending part comprises a first preliminary bending part having a first recess inclined by a first angle,
   wherein the one pair of wings are bent by the first angle while passing through the first recess.

7. The apparatus of claim 6, wherein the first recess is formed by a flat surface and one pair of inclined surfaces, the one pair of inclined surfaces are connected adjacent to the flat surface, and the flat surface is positioned between the one pair of inclined surfaces.

8. The apparatus of claim 6, wherein the preliminary bending part comprises a second preliminary bending part having a second recess inclined by a second angle, the second recess is formed by a flat surface and one pair of inclined surfaces, the one pair of inclined surfaces are connected adjacent to the flat surface, and the flat surface is positioned between the one pair of inclined surfaces.

9. The apparatus of claim 6, further comprising a main bending part configured to bend the adhesive paper passing through the preliminary bending part,
   wherein the main bending part comprises:
   a support part configured to support the adhesive paper to be moved without being deviated; and
   a first main bending part configured to bend any one of the one pair of wings of the adhesive paper which is moved through the support part sequentially until the one wing comes into contact with the center area,
   wherein the first main bending part comprises a plurality of inclined heads, and respective inclination angles of the heads are different from one another.

10. The apparatus of claim 9, wherein the main bending part comprises a second main bending part configured to bend the other wing of the one pair of wings of the adhesive paper which is moved through the support part sequentially until the other wing comes into contact with the center area, and
   wherein the second main bending part comprises a plurality of inclined heads, and respective inclination angles of the heads are different from one another.

* * * * *